United States Patent [19]
Lau

[11] Patent Number: 6,075,710
[45] Date of Patent: Jun. 13, 2000

[54] LOW-COST SURFACE-MOUNT COMPATIBLE LAND-GRID ARRAY (LGA) CHIP SCALE PACKAGE (CSP) FOR PACKAGING SOLDER-BUMPED FLIP CHIPS

[75] Inventor: John H. Lau, Palo Alto, Calif.

[73] Assignee: Express Packaging Systems, Inc., Palo Alto, Calif.

[21] Appl. No.: 09/248,875

[22] Filed: Feb. 11, 1999

Related U.S. Application Data

[60] Provisional application No. 60/074,418, Feb. 11, 1998.

[51] Int. Cl.$^7$ ....................................................... H05K 1/18
[52] U.S. Cl. .......................... 361/760; 361/764; 361/765; 361/767; 257/737; 257/738; 257/778; 174/255; 174/260; 174/261; 174/266
[58] Field of Search .................................... 361/760, 764, 361/765, 767, 772; 257/737, 738, 778, 780; 228/180.21, 180.22; 174/250, 254, 255, 260, 261, 266

[56] References Cited

U.S. PATENT DOCUMENTS

| | | | |
|---|---|---|---|
| 5,258,648 | 11/1993 | Lin .......................................... | 257/778 |
| 5,450,283 | 9/1995 | Lin et al. ................................ | 361/704 |
| 5,468,681 | 11/1995 | Pasch ...................................... | 437/183 |
| 5,535,101 | 7/1996 | Miles et al. ............................. | 361/808 |
| 5,598,036 | 1/1997 | Ho .......................................... | 257/738 |
| 5,629,566 | 5/1997 | Doi et al. ................................ | 257/789 |
| 5,703,406 | 12/1997 | Kang ...................................... | 257/778 |
| 5,786,271 | 7/1998 | Ohida et al. ............................ | 438/615 |
| 5,796,590 | 8/1998 | Klein ...................................... | 361/774 |
| 5,977,632 | 11/1999 | Beddingfield .......................... | 257/737 |
| 5,990,546 | 11/1999 | Igarashi et al. ........................ | 257/700 |

Primary Examiner—Leo P. Picard
Assistant Examiner—David Foster
Attorney, Agent, or Firm—Bo-In Lin

[57] ABSTRACT

The present invention discloses a novel electronic package. This semiconductor packaging assembly is for supporting and containing an integrated circuit (IC) chip. The IC chip is supported on a single core double-layer substrate as a flip chip which is solder-bumped with low melting point solder, e.g., a 63 wt % Sn-37 wt % Pb eutectic solder. The flip chip is supported on a single core double-sided FR-4/5 or BT substrate provided with via holes to form via connections interconnecting the solder bumps to a land grid array disposed on the bottom surface of the substrate. The substrate is then surface mounted and soldered onto a printed circuit board which again is provided with low temperature 63 wt % Sn-37 wt % Pb eutectic solder paste for securely attaching the LGA CSP. Simplified processes are employed to assemble the electronic package with high yield processing steps, which can be conveniently carried out. CSP package with high reliability and improved performance characteristics can be achieved with a reduced production cost. This invention further discloses a tape-substrate provided for interposing between a semiconductor chip and a printed circuit board (PCB). The tape substrate includes a bottom insulation layer. The tape substrate further includes a plurality of conductive pads disposed on top of the bottom insulation layer for electrical connection to the semiconductor chip. The tape substrate further includes a plurality of PCB contact-openings opened in the insulation layer and a plurality of PCB contact-pads, each covering one of the PCB contact-openings for electrical connection to circuit on the PCB. The tape substrate further includes a plurality of connection means for interconnecting the conductive pads to the PCB contact-pads.

14 Claims, 7 Drawing Sheets

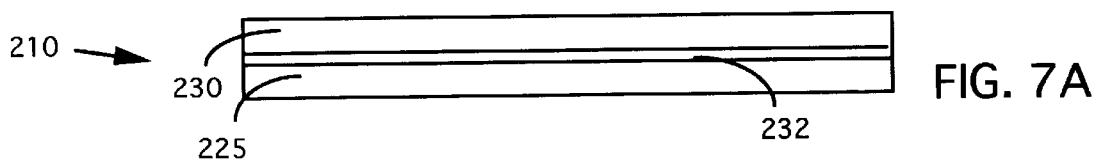
FIG. 7A
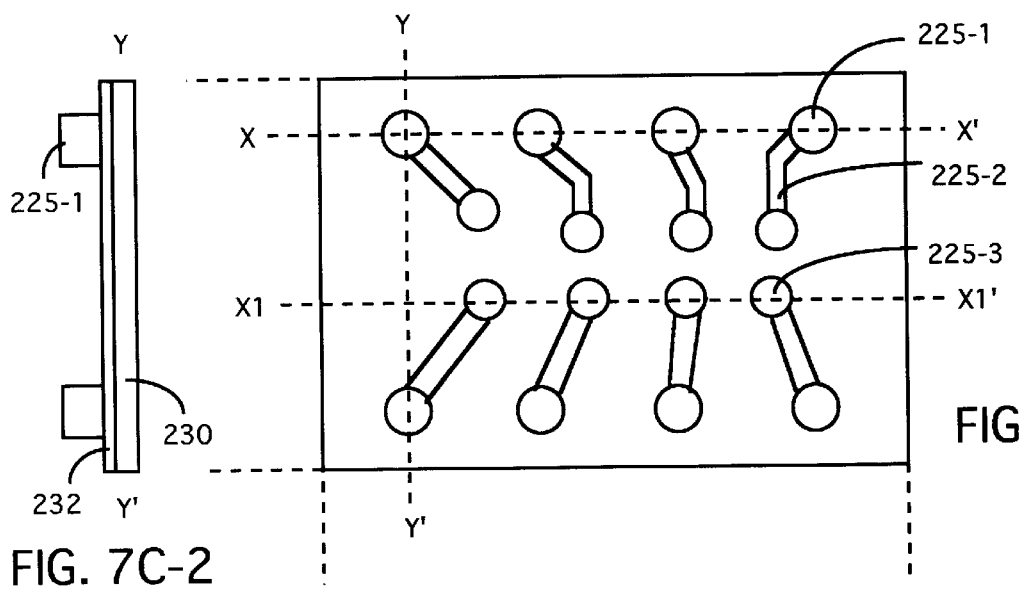
FIG. 7B
FIG. 7C-2
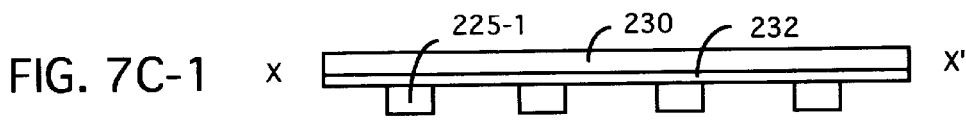
FIG. 7C-1
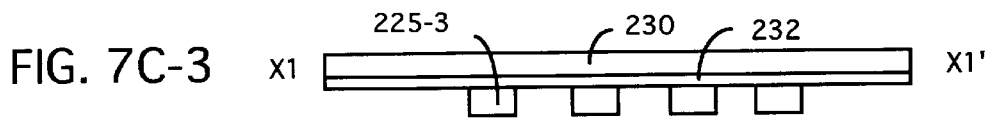
FIG. 7C-3
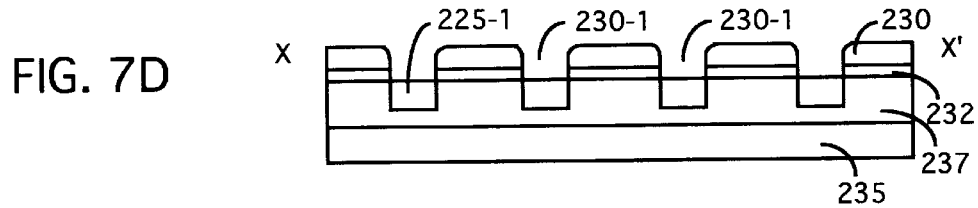
FIG. 7D
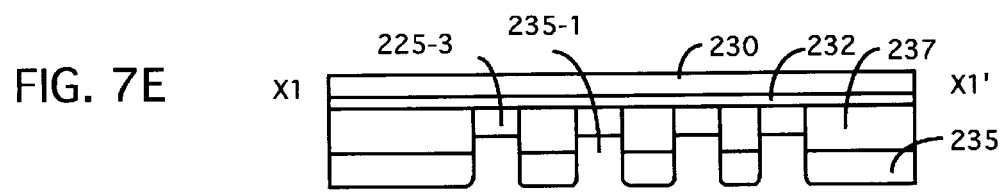
FIG. 7E

LOW-COST SURFACE-MOUNT COMPATIBLE LAND-GRID ARRAY (LGA) CHIP SCALE PACKAGE (CSP) FOR PACKAGING SOLDER-BUMPED FLIP CHIPS

This Application claims a Priority Filing Date of Feb. 11, 1998 benefited from a previously filed Provisional Application No. 60/074,418 by the same inventor as the present Patent Application.

BACKGROUND OF THE INVENTION

1. Field of the Invention

This invention relates generally to the electronic package. More particularly, this invention relates to a novel package assembly for semiconductor memory devices and application specific integrated circuit (ASIC) wherein a solder-bumped flip chip is packaged on a low cost land-grid array (LGA) chip scale package (CSP). The low-cost package requires no solder-balls on the package substrate. The weight, size, and profile-height of the electronic package are reduced. Better electrical and thermal performance is achieved. Also, the electronic package is produced at a very low cost by employing simplified and high-yielding processes.

2. Description of the Prior Art

Several difficulties still limit the broad applications of a chip scale packaging technology in the electronic-packaging industry despite the fact that chip scale packages (CSP) provide many advantages. These advantages include but not limited to the reduced sizes, weights and more reliable electrical connections achievable with this packaging configuration. Specifically, a major difficulty is related to the issue of CSP production cost The industry is not very successful in providing practical CSP assemblies, which can be manufactured by simple processes at more competitive low costs. Related to the issue is also the manufacture equipment, the materials, the yields of each production-step, and the complexity involved in implementing the manufacturing processes. Due to those reasons, even though there are at least forty different kinds of CSP packages, and even there are continuous efforts to improve the state of the art of electronic packaging, these CSP packages are either too expensive or difficult to attach to a printed circuit board (PCB). A low cost CSP package manufactured by simple processing step to produce highly reliable IC packages is still a goal, which cannot be easily achieved.

The following descriptions are provided for better understanding of the art of electronic packaging technology. One of the difficulties in shrinking the size of an electronic package assembly is due to the area requirements of a substrate to support and contain the IC device. Certain substrate areas are required to spread the metal traces outwardly, i.e., fanning out of the metal traces toward the perimeter of the substrate, in order to form connections to the solder balls or contact pads for external circuit interfaces during next level of integration. The areas required for a substrate applied to fan out the metal traces could become as large as eight to fifteen times the size of the IC chip unless multiple layers are used to reduce the surface areas. The fan out requirement often offsets the space savings achieved by increasing the circuit density with smaller line-widths.

Modern semiconductor packages typically includes a substrate to mount an integrated circuit (IC) chip thereon. The areas on the top surface of the substrate next to the mounted chip are then applied to redistribute or fan out the input and output signals from the IC device. The substrate can be a metal, e.g., copper lead-frame, a laminated epoxy glass, or a ceramic plate. Polymeric encapsulants or plastic molding compounds are used to seal off the device. As the clock speed increases to several hundred megahertz or higher, the speed of signal redistribution impacted by the packaging configurations often becomes a limiting design factor of device performance. Conventional electrical circuit design and packaging technology may no longer be adequate to satisfy the high-speed signal transmission requirements. For high-speed high performance devices, in order to overcome the limitations, there is a demand for improved circuit design and packaging techniques where the signal redistribution processes can be more rapidly and reliably carried out.

A technique to improve the signal redistribution from the semiconductor device is to form a ball-grid array (BGA) assembly package, as that shown in FIG. 1 which shows a cross sectional view for a conventional BGA package assembly 10. The package assembly 10 is formed on a multiple layer substrate 15 which supports a semiconductor device 20 disposed in a center portion of the substrate 15. A plurality of wires 25 for connecting the ground, the power and the signal input and output terminals on the semiconductor device 20 are formed to contact the bonding pads 30 disposed near the semiconductor device 20. The pitch between the bonding pads, i.e., the distance between the bonding pads, is approximately eight to ten mils with a gap of three to six mills between the pads. For each bonding pad 30, a metal trace 35 is formed to spread out toward the outer perimeter of the substrate 15 in order to be compatible with the pitches of the regular connection terminals provided on a printed circuit board (PCB). The connection terminals on the PCB are for next level of integration to an electronic device, e.g., a board for a personal computer. These metal traces 35 are formed to have a fan shape such that the distance between them are gradually increased. On the outer edge of the substrate 15, a plurality of through-holes 40 are formed to connect the metal traces 35 to a plurality of solder balls 45 disposed on the bottom surface of the substrate 15. The pitches between the solder balls are now increased to approximately fifty mils. The solder balls 45 are arranged to have compatible configuration suitable to conveniently connect to contact terminals formed on a printed circuit board to be incorporated into an electronic device.

Applying a technique discussed above, there is an intrinsic area requirement near the semiconductor device 20 in the central portion of the top surface of the substrate 15. This area is required to allow a space for outward extension of the metal traces 35 in fanning out toward the edge of the substrate 15. Therefore, in this type of configuration, the bonding pads 30 are disposed near the semi-conductor device 20. An outward spreading distribution for metal traces 35 are applied to achieve signal "redistribution", in order to transmit the signals to the solder balls 45 via the through holes 40 on the outer edge. Therefore, a substrate 15 must have significantly greater area than the semiconductor device 20.

More recently, a chip scale packaging (CSP) technology is employed to reduce the size of the electronic packages. A CSP package disclosed by Motorola is shown in FIG. 2. The unique feature of the CSP is to use a substrate carrier or interposer to redistribute the very fine pitch of the peripheral pads on the chip, e.g., as small as 0.075 mm, to a much larger pitch, e.g., 1.0 mm, 0.75 mm or 0.5 mm, area array pads on the PCB. In general, the CSP packages have the advantages that they are easier to test and burn-in for the known-good dies. They are also easier to handle, to assemble, to rework, to standardize, to protect the die, to process die-shrink and are subjected to less infrastructure constrains. The Motorola's CSP as shown in FIG. 2 is a slightly larger than IC carrier (SLICC) package. Motorola's SLICC package is designed to provide all the advantages discussed above. However, the SLICC shown in FIG. 2 implements a high temperature 95 wt % Pb-5 wt % Sn or 97 wt % Pb-3 wt % Sn solder bumped chips and solder balled substrate configuration. In order to be surface mount compatible, a layer of 63 wt % Sn/37 wt % Pb solder must be coated on the substrate. It is difficult to reduce the production cost of this package due to its more complicate processing steps involved in processing the high temperature solder-bumps and the solder-balls implemented in the CSP package.

Another CSP package is a LGA package disclosed by Matsushita (Kunitomo, Y. "Practical Chip Size Package Realized by Ceramic LGA Substrate and SBB Technology" Proceeding of SMI Conference, August 1995, pp 18–25). Gold stud bump bonding (SBB) technology with isotropic conductive adhesive is employed to assembly the chip to the ceramic substrate. Such process is quite expensive. Furthermore, the CSP's solder joints on a printed circuit board are not reliable due to large thermal expansion mismatch. The thermal expansion coefficients (TEC) of the ceramic substrate is 6.5×10-6 in/° C. and that of the FR-4 PCB is 18.5×10-6 in/° C.

Therefore, a need still exits in the art to provide an improved package assembly with novel and simplified processing steps to reduce the production costs of the CSP packages.

SUMMARY OF THE PRESENT INVENTION

It is therefore an object of the present invention is to provide a low cost surface-mount compatible land-grid array (LGA) chip scale package (CSP) for packaging a flip chip in order to overcome the aforementioned difficulties encountered in the prior art.

Specifically, it is an object of the present invention to provide a surface-mount compatible land-grid array (LGA) chip scale package (CSP) for packaging a solder-bumped flip chip wherein solder bumps of low melting point are employed. Cost reduction is achieved because simplified assembling processes can be applied to assemble an IC chip, which is bumped with low melting point solders.

Another object of the present invention is to provide a surface-mount compatible land-grid array (LGA) chip scale package (CSP) for packaging a solder-bumped flip chip wherein a land-grid array is used for mounting a substrate to a printed circuit board. The production cost is further reduced because there is no need to place the solder balls on the substrate and a self aligned mounting process is achievable by applying the surface mount technology.

Another object of the present invention is to provide a surface-mount compatible land-grid array (LGA) chip scale package (CSP) for packaging a solder-bumped flip chip wherein a single core-two layer substrate is employed to support an IC chip. The manufacture and packaging process are simplified while the electrical and thermal performance characteristics are improved with such a substrate.

Briefly, in a preferred embodiment, the present invention comprises a semiconductor packaging assembly for supporting and containing an integrated circuit (IC) chip. The IC chip is a flip chip which is solder-bumped with low melting point solders, e.g., 63 wt % Sn-37 wt % Pb eutectic solder. The flip chip is supported on a single core double-sided FR-4 or BT substrate provided with via holes to form connections interconnecting the solder bumps to a land grid array disposed on the bottom surface of the substrate. The substrate package is then surface mounted and soldered onto a printed circuit board which again is provided with low temperature 63 wt % Sn-37 wt % Pb eutectic solder pastes for securely attaching the LGA CSP. Simplified processes are employed to assemble the electronic package with high yield processing steps, which can be conveniently carried out. CSP package with high reliability and improved performance characteristics can be achieved with a reduced production cost.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIGS. 7A to 7E are a series of cross sectional and bottom view of a tape substrate of this invention to form the chip-size flip-chip package assembly of this invention.

DETAILED DESCRIPTION OF THE PREFERRED EMBODIMENT

Figure 3:
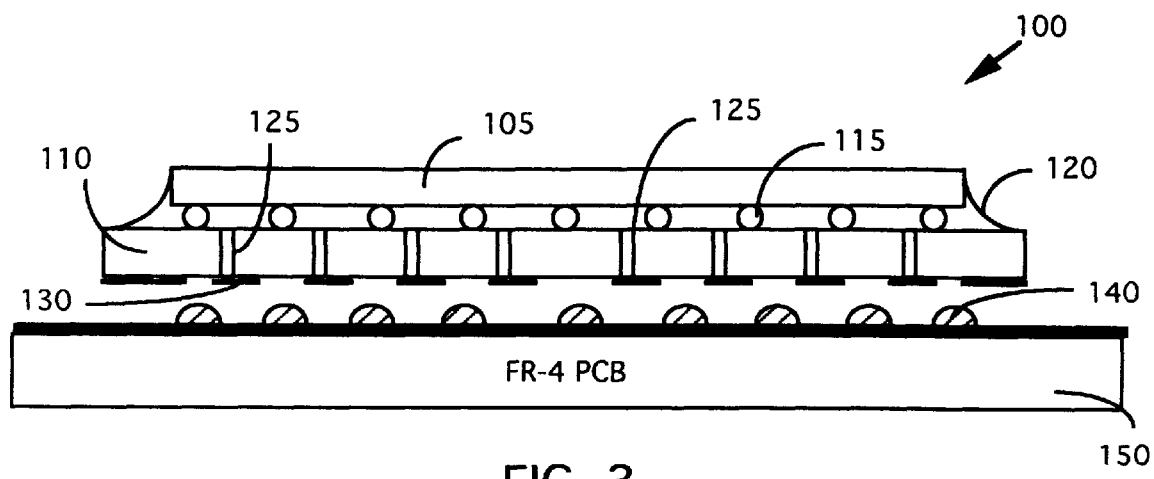
FIG. 3 is a cross sectional view of an electronic package manufactured according to the configuration of the present invention.
Figure 3A:
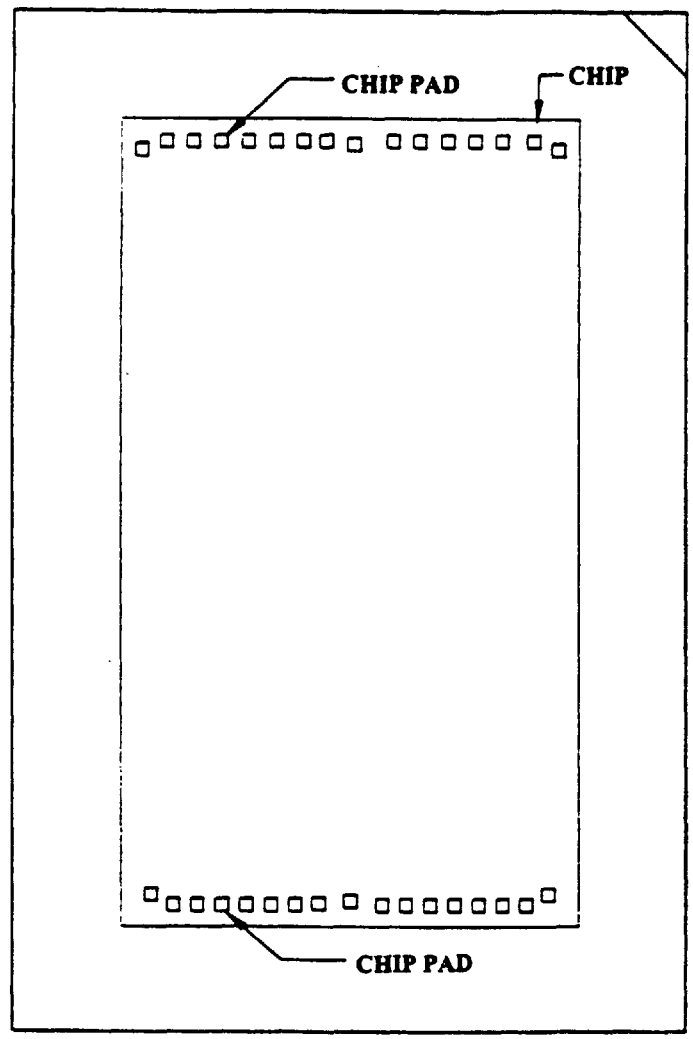
FIG. 3A is a partial top view of a flip-chip showing the solder-bumps placed at the peripherals of the chip.
Figure 3C:
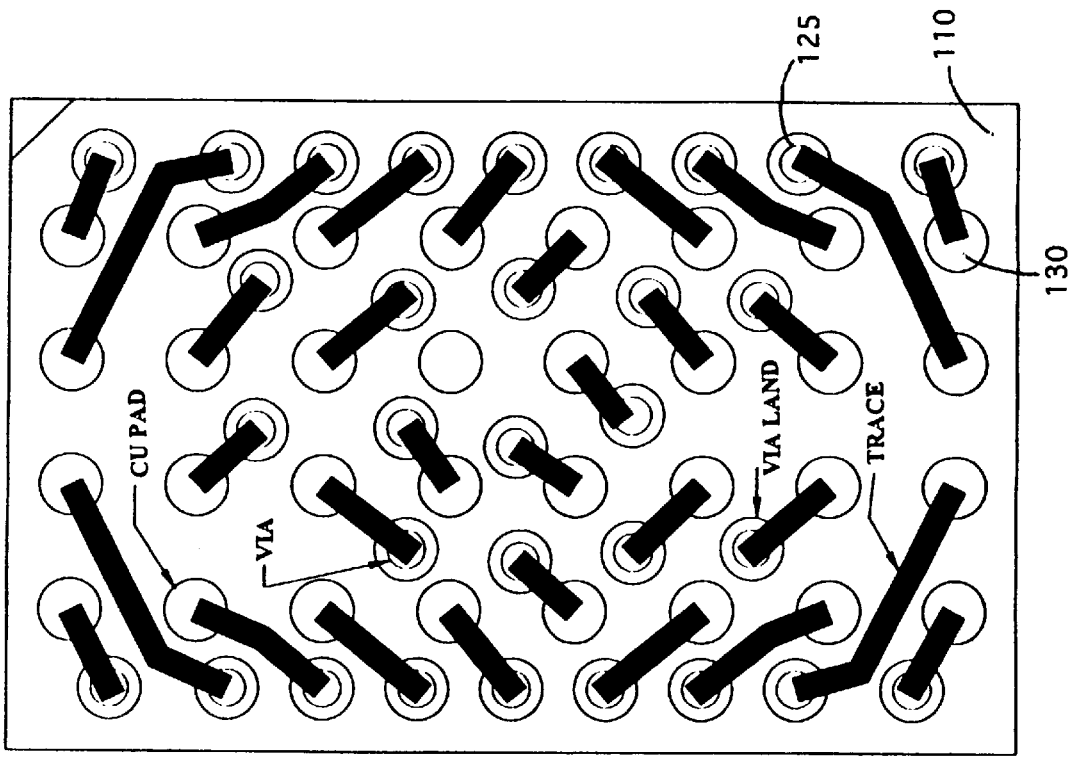
FIGS. 3B and 3C show the top view and bottom view of the substrate where the plated via connections interconnect the solder pads placed on the top surface of the LGA substrate to the bottom surface through metal traces.
Figure 3B:
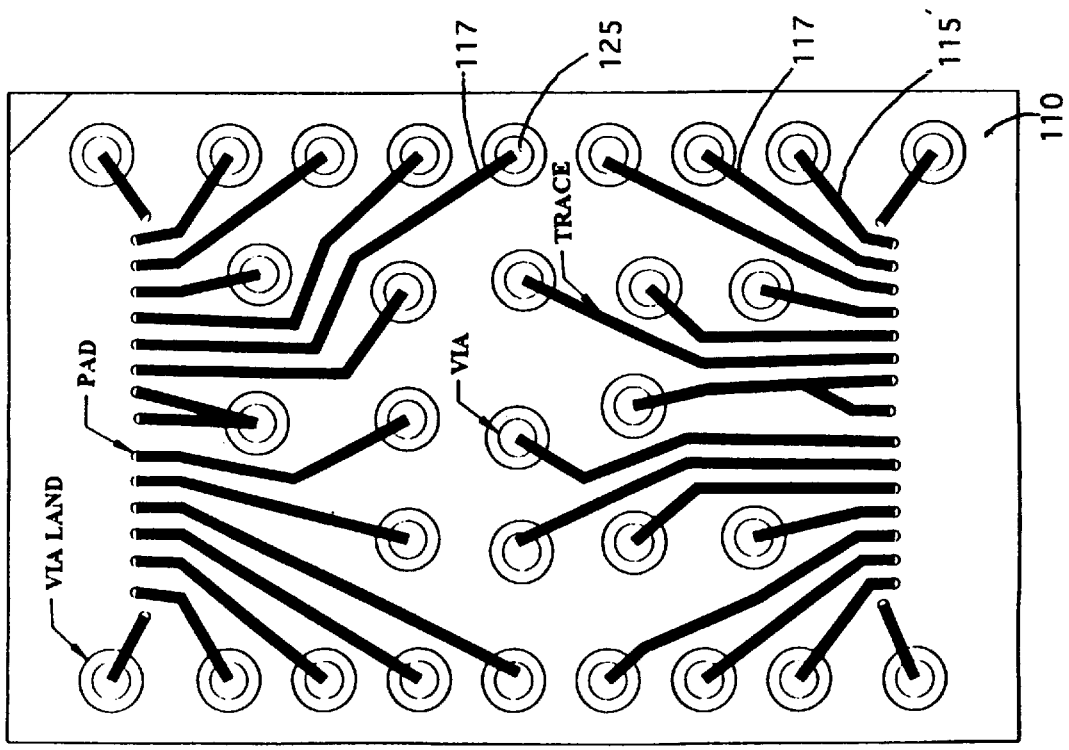

Referring to FIG. 3 for a cross sectional of an electronic package 100 of the present invention. The electronic package 100 containing an integrated circuit (IC) device 105 therein, which is arranged as a solder-bumped flip chip supported on a substrate 110. The electric circuit elements of the integrated circuit device 105 are arranged to connect to a plurality of solder bumps 115 formed on the top surface of the IC chip 105. The solder-bumps typically formed on the peripheral of the flip-chip 105 as that shown in FIG. 3A. For each of these solder bumps, which has a size of about 0.09 by 0.09 mm, a corresponding solder pad 115' is disposed on the top surface of the supporting substrate 110 as that shown in FIG. 3B. From each of these solder pads, a conductive trace 117 is fanned inwardly to a plated via hole 125. The plated via-holes, e.g., copper plated via-holes 125, are then dropped to the bottom surface of the substrate 110 (See FIG. 3C) for connection to a land-grid array 130. An encapsulant under filling 120 is employed to encapsulate the flip chip 105 supported on the substrate 110. The detail structure of the connections 130 for next level integration, which is a land-grid array (LGA), will be further described in FIGS. 4A and 4B below. The LGA 130 is then arranged to contact and soldered onto a printed-circuit board (PCB) 150 through the solder pastes 140, which are a plurality of 0.15 mm (6 mils) thick solder pastes.

The electronic package 100 as shown above utilizes a solder bumped flip chip technology. The technology is particularly useful for chips with lower power and pin-count applications. The design concept utilizes the FR-4/5 or BT substrate to redistribute the very fine pitch peripheral pads 115' on the IC chip 105 to a land grid array 130 disposed on the bottom surface of the substrate of much larger pitch through the plated via 125. This is achieved by fanning the traces 117 inwardly from the peripheral pads 115' on the top layer of the substrate 110. The plated via-connections 125 through the via-holes are used to for providing connection to the pads of the LGA 130 on the bottom side of the package substrate 110. The package 100 as shown has several advantageous design features, namely, the package is a LGA package that can be soldered onto PCB 150 through a 0.15 mm (6 mils) thick solder pastes 140 to form solder joints with 3 mils (0.08 mm) joint height. The production cost of this package is low because it has a simplified structure provided with a substrate 110, which is a single-core two-layer package. A small package size is achieved because the traces are redistributed inwardly from the peripheral pads with very fine pitch on the top surface of the substrate 110 to a larger area under the IC chip 105. The pads 130 (see FIGS. 4A or 4B), of the LGA are copper pads formed as area-array with a pitch ranging from 0.5 to 1.0 mm. The package body size supported on the substrate 110 is almost the same as the size of the IC chip 105 and this package is totally compatible with surface-mount technology. With a LGA array, the package further is also self-aligned for soldering onto the PCB 150. Protected by the under-fill encapsulant 120, the solder bumps of the IC chip 105 are reliably attached to the substrate 110. Furthermore, because a small mismatch of the temperature expansion coefficients (TECs between the substrate 110, i.e., TEC is about 17×10-6 in/° C., and the PCB 150, i.e., TEC is 18.5×10-6 in/° C., the solder joints of the land-grid-array 130 are very reliable.

By employing the solder bumps 115 for connection to plated via connections 125 penetrating through the substrate 110, the requirement of bonding wires for indirect connection to other contact pads disposed on the substrate 110 is eliminated. Direct electric contact is provided through the solder bumps 115 and the via-connections 125. The direct electric contact is more reliable and has better electrical performance characteristics. The via-connections 125 can further serve to conducting heat generated from the IC chip 105 to the substrate 110 and then to the PCB 150.

Figure 4A:
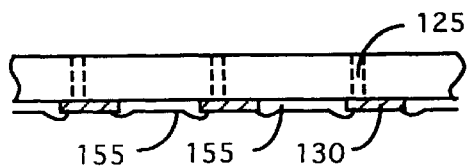
FIGS. 4A and 4B shows two alternate cross sectional views of the electronic package manufactured according to the connection configuration of the present invention wherein a plurality of solder pads are employed with the solder masks differently configured.
Figure 4B:
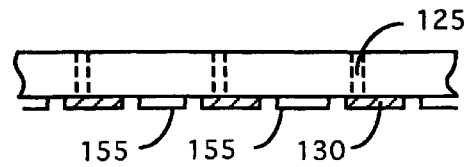

Referring to FIGS. 4A and 4B for two alternate configurations of the next-level integration connection means, e.g., the land-grid-array 130, formed on the bottom surface of the substrate 110. In FIG. 4A, a plurality of solder masks 155 overlaying the edge portions of the solder pads, while the solder masks 155 are disposed with a distance from the solder pads 130 and are separated from the solder pads 130. The solder pads are employed to accomplish finer pitch than the solder balls. Because of the smaller substrate 110 for supporting the semiconductor IC chip 105, solder masks would be a preferred way of providing the external connections than the solder balls when finer pitches are required.

In comparison to Motorola's slightly larger than IC carrier (SLICC), instead of the high temperature 95 wt % Pb-5 wt % Sn or 97 wt % Pb-3 wt % Sn solder bump chip, the solder bumps 115 of this invention employ low temperature 63 wt % Sn-37 wt % Pb eutectic solder. The bumped chip can be conveniently mounted onto the substrate 110 by a reflow operation at a maximum temperature about 230° C. The same low temperature 63 wt % Sn-37 wt % Pb eutectic solder pastes 140 disposed on the PCB 150 are also employed for soldering and mounting the substrate 110 onto the PCB 150. Organic coated copper (OCC) pads on FR-4/5 or bismaleimide triazine (BT) substrate are employed without requiring a 63 wt % Sn-37 wt % Pb solder coating. Also, the electronic package 100, as shown in FIG. 3, is a land-grid-array without solder balls. Therefore, the electronic package 100 can be produced with reduced cost when compared to Motorola's SLICC package. Because of these design features, the electronic package as disclosed by this invention is a very simple and low cost package. Simplified package assembly processes can be employed with a step-by-step flow diagram shown in FIG. 5.

According to FIG. 3 and above descriptions, a chip scale electronic package assembly 100 provided for supporting and containing an integrated circuit (IC) chip 105 disposed as a flip-chip therein. The package assembly includes a substrate 110 of substantially same size and same shape as the IC chip 105 having a top surface and a bottom surface. The substrate further includes a plurality of plated via-connections 125 defined by a plurality of via-holes penetrating the substrate from the top surface to the bottom surface and plated with a conductive material. The package assembly further includes a plurality of solder bumps 115 in electrical connection with the via connections 125 and disposed on the top surface of the substrate for direct contact with electrical circuits on the IC chip 105 wherein the solder bumps 115 composed of a low-melting solder-paste. The package assembly further includes a plurality of next level integration connection means 130 in electric connection with the via connections 125 and disposed on the bottom surface of the substrate constituting a land-grid array (LGA) provided for mounting the LGA substrate onto a printed circuit board 150. In a preferred embodiment, the low-melting point solder 115 is a 63 wt % Sn-37 wt % Pb eutectic solder. In another preferred embodiment, the land-grid array disposed on the bottom surface of the substrate further includes a plurality of solder masks. In a preferred embodiment, the package assembly further includes a printed circuit board 150 provided with PCB solder pastes 140 for the land grid array 130 to solder onto the PCB solder pastes 140 for attaching the substrate securely onto the PCB 150. In yet another preferred embodiment, each of the PCB solder pastes 140 composed of a 63 wt % Sn-37 wt % Pb eutectic solder paste disposed on a top surface of the PCB board 150.

As an example to show one preferred embodiment, a package for assembling and containing a 32-pin SRAM memory chip manufactured on an eight-inch wafer is described below. The chip size is about 3.556 mm by 6.324 mm with a pad size of approximately 0.09 mm by 0.09 mm and a minimum pad pitch 0.192 mm. Two pads are for ground and two pads are for power. The chip has a thickness of about 0.675 mm. The eight-inch wafers are solder-bumped by electroplating method with titanium and copper under-bump metallurgy (UMB). It is formed by sputtering and etched with a solder-bump mask to define the solder bump pattern followed by coating a copper layer. The solder bumps are electroplated with 63 wt % Sn-37 wt % Pb eutectic solder. The resist is then removed and the Ti/Cu is striped off with a hydrogen peroxide etch. The wafers are reflowed at 215° C. to create smooth spherical solder bumps.

Based on the above chip design and performance characteristics, a substrate according to the major features of this invention is formed to support this chip. The processing steps are very simple and easy to carry out with high yields. For these reasons, the land-grid array chip scale package for containing and supporting a flip-chip of this invention can effectively reduce the production cost of an electronic package assembly.

Figure 5:
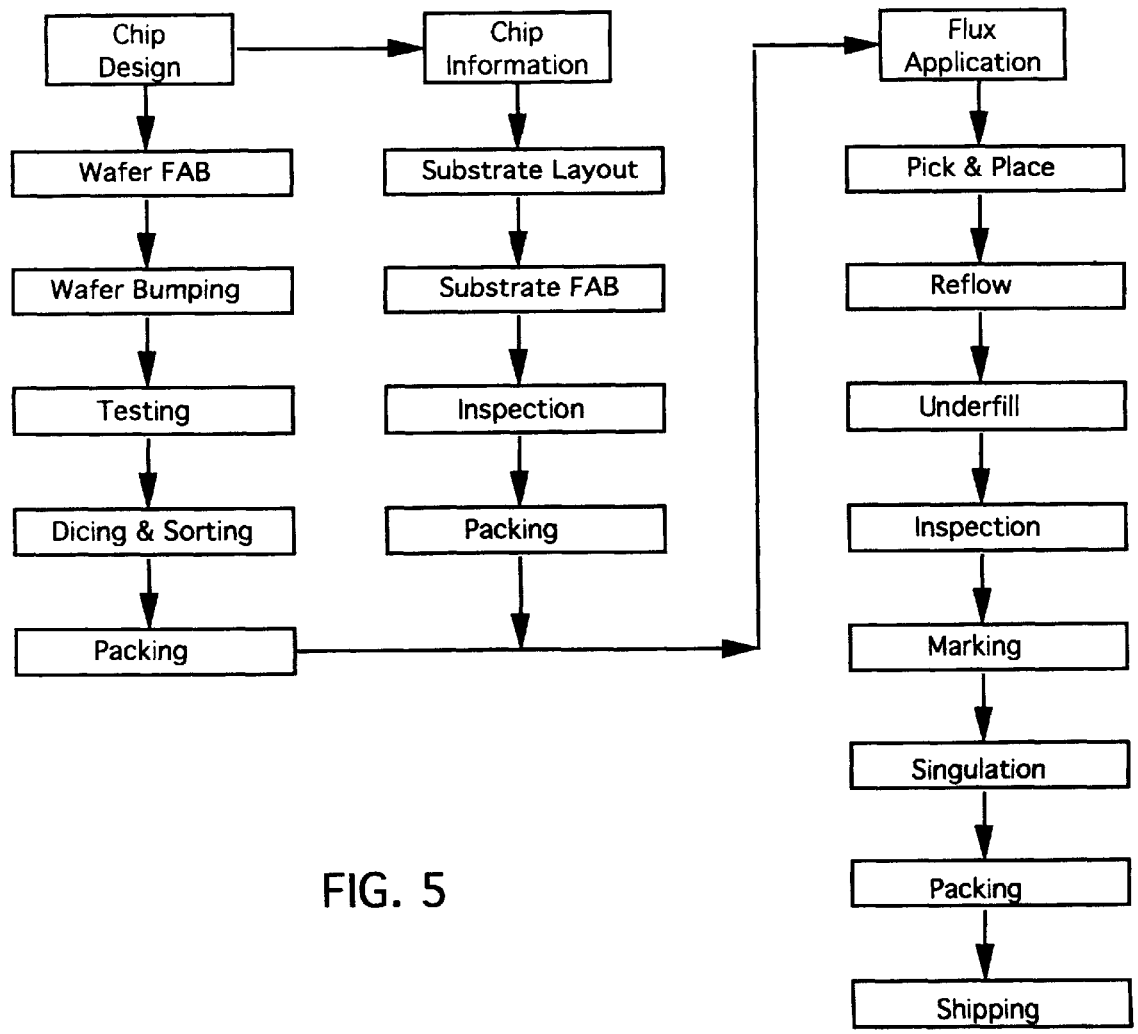
FIG. 5 is a flow chart to show the processing step of an electronic package assembly of the present invention with a rigid substrate.

A more detail description of each of the processing steps with testing results and performance analyses are shown in FIG. 5 and also described in a paper published in the NEPCON West Conference Proceedings (pp. 883–908) held in Anaheim Calif. on Mar. 3, 1998. The same paper also was published in Technical Journal of the Printed Circuit and Interconnection Federation (PCIF) Circuit World Volume 24, Number 3, April 1998, MCB University Press [ISSN 0305-6120] (pp. 11–25). A copy of this paper related to the processing steps of assembling and packaging the 32-pin SRAM is also included as part of this application as Appendix A. The content of the paper is incorporated by reference as part of this application.

Figure 6:
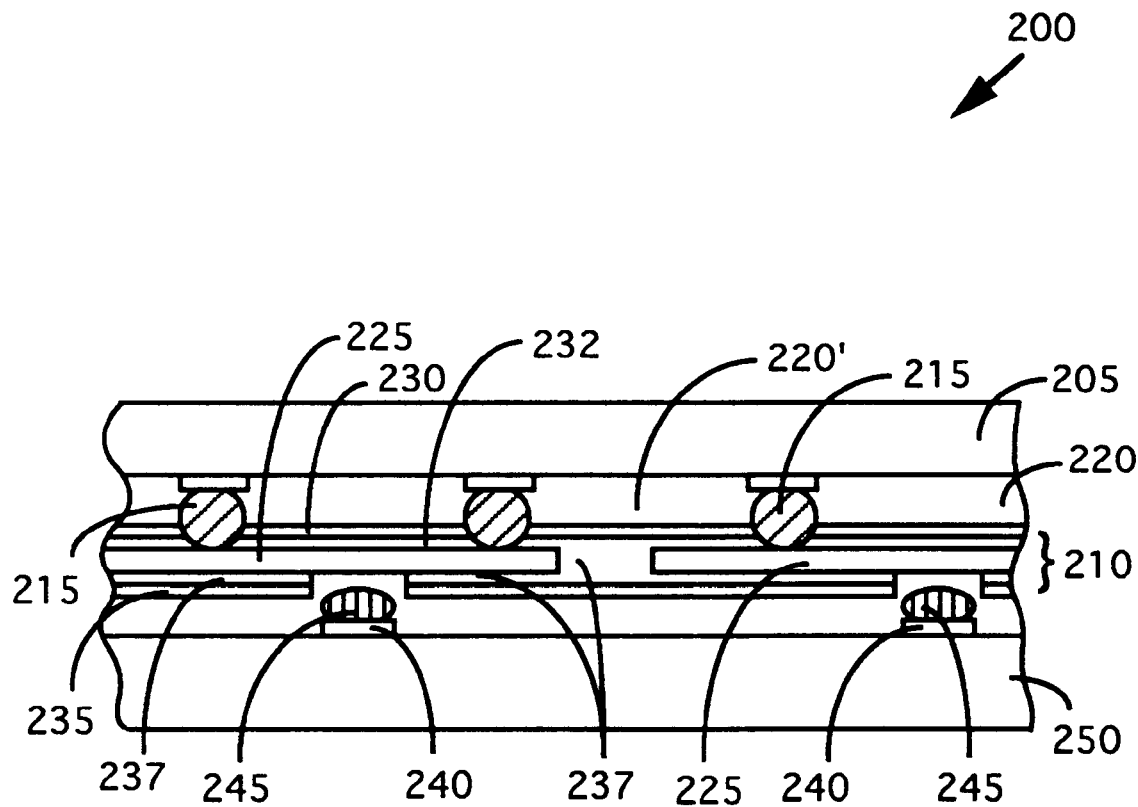
FIG. 6 is a cross section view for showing the structure of an electronic package with a tape substrate, i.e., a flexible substrate, interposing between a semiconductor IC chip and a printed circuit board.

FIG. 6 is a cross-sectional view of an electronic package 200 of this invention. The electronic package 200 is a chip scale electronic package (CSP) assembly. The package assembly 200 is provided for supporting an integrated circuit (IC) chip disposed as a flip-chip 205. The flip chip 205 is similar to that shown in FIG. 3A has a plurality of solder bumps 215 for mounting onto a tape-substrate 210. The tape substrate 210 includes a top polyimide layer 230 and a bottom polyimide layer 235 attached with a top and a bottom adhesive layers 232 and 237 respectively to a copper layer 225. The top insulation layer 230 and the top adhesive layer 232 are etched or drilled with solder openings to receive the solder bumps 215 of the IC chip 215 for contacting with the copper layer 225. The tape substrate 210 supports the flip chip 205 is then mounted on a printed circuit board 250. The bottom insulation layer 235 and the bottom adhesive layer 237 are etched or drilled with a plurality of solder paste openings to receive the solder pastes 245 for contacting the copper layer 225. The solder pastes are composed of low melting point solder pastes of 63 wt % Sn-37 wt % Pb eutectic solder. The copper layer 225 provides a conductive connection between the solder bumps 215 connected to the flip chip 205 with the conductive lines 240 disposed on the PCB through the solder pastes 245 placed on top of the copper lines 240. The package assembly 200 is then protected with an encapsulant 220 and under-fill material 220' between the solder bumps 215 underneath the flip-chip 205. In a preferred embodiment, the tape substrate 210 has a thickness ranging from one to four mils.

For the purpose of forming an electronic assembly, the solder bumps 215 on the flip chip are electroplated with low-melting point 63 wt % Sn-37 wt % Pb eutectic solder. The solder bumps 215 are soldered onto the copper layer 225 patterned on the tape substrate at a reflow operation. The semiconductor chip 205 soldered to the tape substrate 210 can then surface mounted onto the PCB board 250. The mounting is achieved by soldering the solder pastes 245 to the copper layer 225 through the solder paste contact-openings where the copper layer 225 of the tape substrate 210 is patterned to provided predetermined electric connections.

The electric performance of such a package is greatly improved because the very small thickness under four mills of the tape substrate 210. Furthermore, compared to a rigid substrate 110 of FIG. 3, the tape substrate of this embodiment has a further advantage. Even that a very thin rigid substrate, e.g., a four-mill substrate, can also be employed, the rigid substrate 110 is a single-core, two-layer substrate. In contrast, the tape substrate 210 is a single-layer substrate where the signal connections are more direct. Adverse effects on the electrical performance due to transmission of signals over a distance across the thickness of a rigid substrate are substantially eliminated by using the tape-substrate as described in FIG. 6.

According to FIG. 6, this invention discloses a tape-substrate 210 provided for interposing between a flip-chip 205 with a plurality of solder bumps 215 and a printed circuit board (PCB) 250 with a plurality of solder pastes 240. Each of the solder pastes 240 is provided for electrically connecting to one of the solder bumps 215. The tape substrate 210 having substantially a same size and shape as the flip-chip 205 and includes a conductive layer, e.g., a copper layer 225. A top and bottom insulation layers, i.e., layers 230 and 235 respectively, cover the conductive layer 225. Each of these insulation layers 230 and 235 is attached to the conductive layer 225 with an adhesive layer, i.e., the adhesive layers 232 and 237 respectively. A plurality of solder bump openings are opened through the top insulation layer 230 and the adhesive layer 232 to allow the solder bumps of the flip chip 205 to contact the conductive layer 225. A plurality of solder paste openings are opened through the bottom insulation layer 235 and the adhesive layer 237 to allow the solder pastes 245 of the printed circuit board 250 to contact the conductive layer 225. In a preferred embodiment, the tape-substrate 210 has a thickness ranging between one to four mils. In another preferred embodiment, the conductive layer 225 composed of copper. In another preferred embodiment, the top insulation layer 230 and the bottom insulation layer 235 composed of polyimide.

In summary, this invention further discloses a tape-substrate provided for interposing between a semiconductor chip and a printed circuit board (PCB). The tape substrate 210 includes a patterned conductive layer 225 includes a plurality of solder-bump contact pads 225-1 each having a corresponding solder paste contact pad 225-3 interconnected with a conductive trace 225-2. The tape substrate 210 further includes a top insulation layer 230 having a plurality of solder-bump contact openings opened on top of each of the solder-bump contact pads. The tape substrate 210 further includes a bottom insulation layer 235 having a plurality of solder-paste contact openings open right below the solder-paste contact pads.

Figure 1:
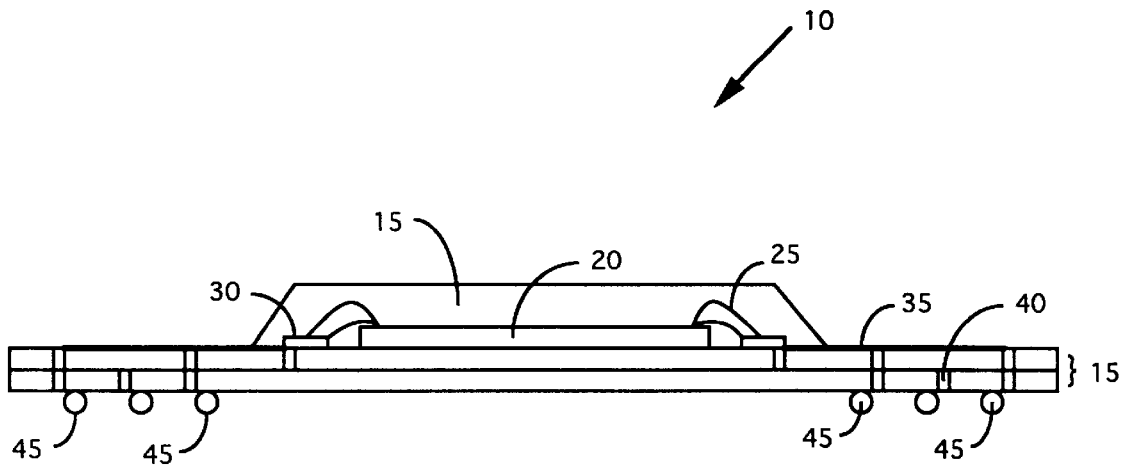
FIG. 1 is a cross sectional view for a prior art circuit connection configuration for electronic packaging applying a metal trace fan-out technique for carrying out the signal redistribution on a substrate.
Figure 2:
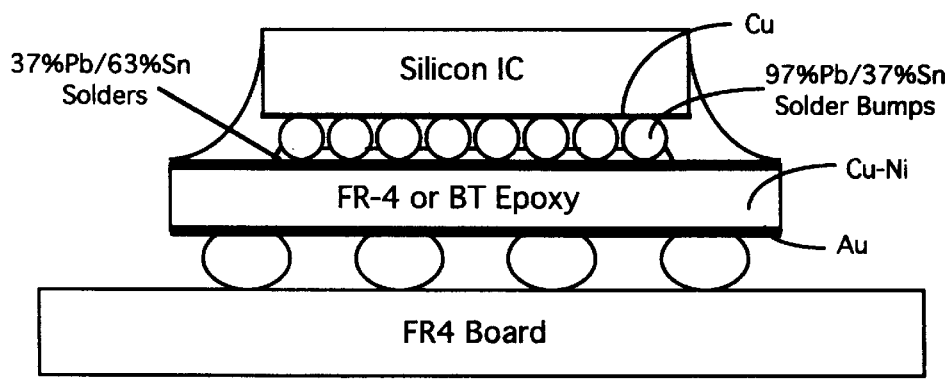
FIG. 2 shows a cross sectional view of another prior art package assembly configured as a chip scale package assembly disclosed by a major electronic manufacturing company.

FIGS. 7A to 7E are a series of cross sectional views and top views for illustrating the structure and processing steps for manufacturing the electronic package 200 as that shown in FIG. 6 as a preferred embodiment of this invention. The processes begin with a tape substrate 210, which includes a copper layer 225 covered by a top insulation layer 230 attached to the copper layer 225 via an adhesive layer 232. Unlike a "rigid" BT or FR-4 substrate 110 as that shown in FIG. 3, the tape substrate 210 is a flexible substrate. In FIGS. 7B to 7D, the copper core layer 225 is first patterned. A bottom view in FIG. 7B shows the patterned copper layer 225 covered by the top insulation layer 230 and the adhesive layer 232. The patterned copper layer 225 now includes copper pads 225-1 for contact with the solder bumps 215 on the flip chip 205, the copper traces 225-2, and copper pads 225-3 for contact with the solder pastes 245 placed on top of the copper pads 240 on the PCB 250. FIGS. 7C-1 to 7-C3 are cross section view of the cross sections along the lines X-X', Y-Y' and X1-X1' respectively. A bottom insulation layer 235 is then formed on top of the tape substrate 210. The top insulation layer 230 and the adhesive layer 232 are opened on top of the copper pads 225-1 to provide solder bump openings 230-1 to allow the solder bumps 215 to contact the copper pads 225-1. A cross section view along the X-X' is shown in FIG. 7D. The bottom insulation layer 235 and the adhesive layer 237 are opened on bottom of the copper pads 225-3 to provide solder paste openings 235-1 to allow the solder pastes 245 to contact the copper pads 225-3. A cross section view along the X1-X1' is shown in FIG. 7E. The patterned copper traces 225-2 interconnect the copper pads 225-1 to the copper pads 225-3. The solder bumps 215 are electrically connected to corresponding solder pastes 245 via the copper pads 225-1 to the copper traces 225-2 then to the copper pads 225-3 patterned on the copper layer 225. The locations of the solder pads 225-1 are correspondent to the locations of the solder bumps 215 of the flip chip 205. The locations of the copper pads 225-3 are correspondent to the solder pastes 245 placed on the printed circuit board 250 on top of the copper pads 240 that are connected to conductive circuit lines formed on the PCB 250.

Figure 8:
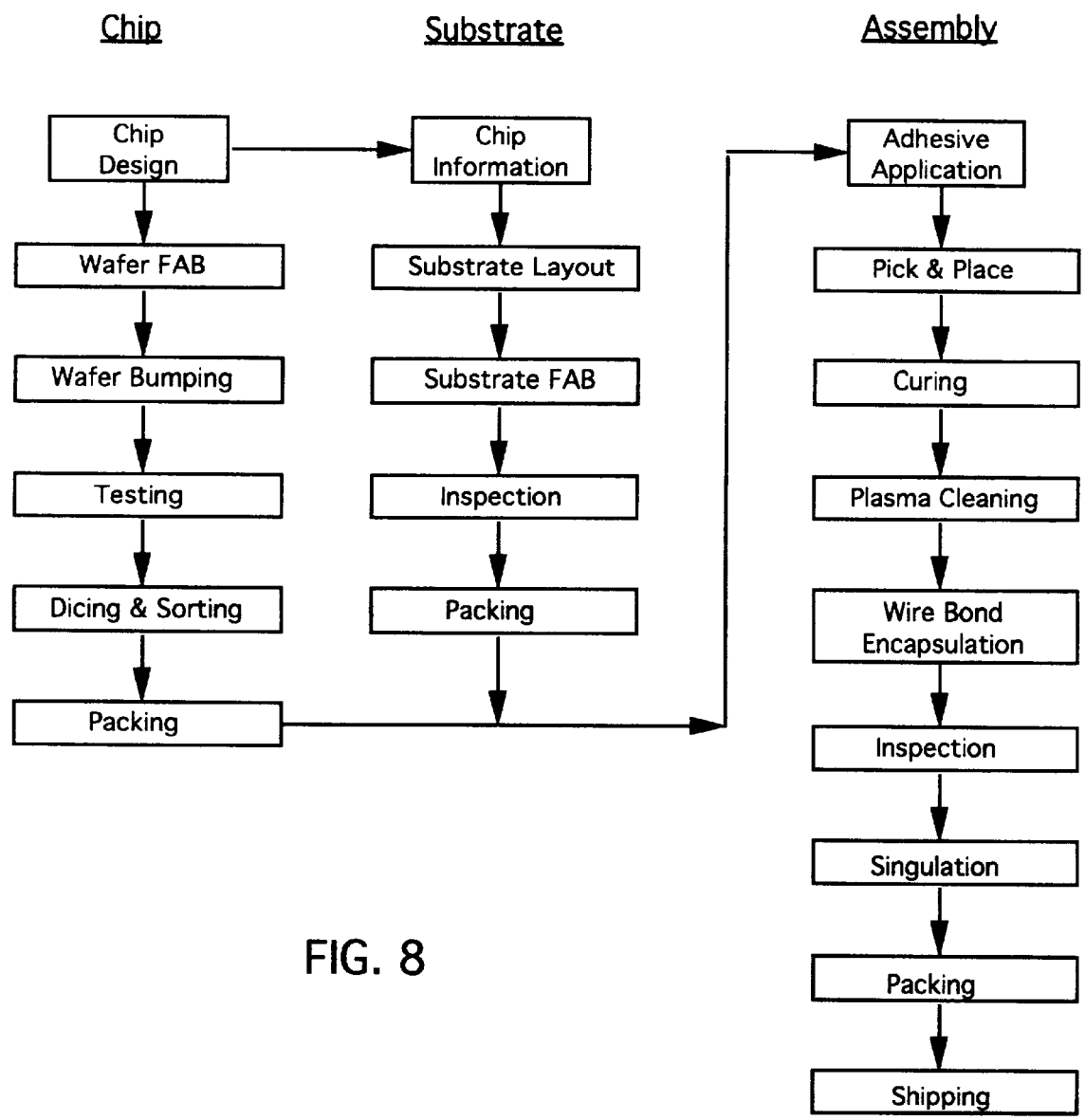
FIG. 8 is a flow chart to show the processing step of an electronic package assembly of FIG. 6 implemented with a tape substrate of the present invention.

According to FIG. 7A to 7E, this invention discloses a method for interposing a tape-substrate between a flip-chip with a plurality of solder bumps and a printed circuit board (PCB) with a plurality of PCB copper-pads with solder paste provided for electrically connecting to a one of the solder bumps. The method includes the steps: a) patterning a conductive layer to form a plurality of solder-bump contact pads at locations corresponding to the solder bumps; b) patterning the conductive layer to form a plurality of solder-paste contact pads at locations corresponding to the solder pastes; c) patterning a plurality of conductive traces for interconnecting each of the solder-bump contact pads to a corresponding solder paste contact pads; d) covering the conductive layer with a top insulation layer and opening a plurality of solder-bump contact openings on top of each of the solder-bump contact pads; e) covering the conductive layer with a bottom insulation layer and opening a plurality of solder-paste contact openings right below the solder-paste contact pads; and f) mounting the IC chip onto the tape substrate with each of the solder-bumps contacting and soldering to the solder-bump contact pads. In a preferred embodiment, the method further includes a step of g) mounting the tape substrate onto the printed circuit board (PCB) with each of the solder-pastes contacting and soldering to the solder-paste contact pads. FIG. 8 is a flow chart showing the manufacturing processes of the chip, the substrate, and the package assembly. The manufacturing processes are simplified with reduced cost and improved electrical and thermal performances because a novel tape-substrate configuration of land-grid array is employed for packaging a CSP solder-bumped flip-chip assembly.

Therefore, the present invention discloses a surface-mount compatible land-grid array (LGA) chip scale package (CSP) for packaging a flip chip for the purpose of overcoming the difficulties encountered in the prior art. In this surface-mount compatible land-grid array (LGA) chip scale package (CSP), solder bumps of low melting point are employed to form chip pads with very fine-pitch on the IC chip. Cost reduction is achieved because simplified assembling processes are applied to assemble an IC chip. A land-grid array is used for mounting a substrate to a PCB. The production cost is further reduced since there is no need to place the solder ball on the substrate and a self-aligned mounting process is achieved by applying a surface mount technology. With a single core-two layer substrate or a tape substrate, i.e., flexible substrate, employed to support an IC chip, the manufacture and packaging process are simplified while the electrical and thermal performance characteristics are improved with such a substrate.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A chip scale electronic package assembly provided for supporting an integrated circuit (IC) chip disposed as a flip-chip having a plurality of solder bumps for external electric connection therefrom, said package assembly comprising:

a tape substrate having a patterned conductive layer includes a plurality of solder-bump contact pads each having a corresponding solder paste contact pad interconnected with a conductive trace wherein each of said contact pads disposed at a location corresponding to one of said solder bumps, and each of said solder paste contact pads disposed at a location corresponding to one of said solder pastes;

said tape substrate further includes a top insulation layer having a plurality of solder-bump contact openings opened on top of each of said solder-bump contact pads;

said tape substrate further includes a bottom insulation layer having a plurality of solder-paste contact openings open right below the solder-paste contact pads;

said IC chip mounted on said tape substrate having each of said solder-bumps electrically contacting a corresponding solder bump contact-pad.

2. The package assembly of claim 1 further comprising:

a printed circuit board having a plurality of copper-pads with solder paste disposed thereon wherein said tape substrate mounted onto said printed circuit board with each of said copper-pads with solder paste disposed in said solder-paste contact-openings for soldering to and electrically connected to a corresponding solder-paste contact-pad.

3. The package assembly of claim 2 wherein:

said solder bumps on said flip-chip and said solder pastes on said PCB composed of a low-melting soldering material.

4. The package assembly of claim 3 wherein:

said low-melting soldering material is a 63 wt % Sn-37 wt % Pb eutectic solder.

5. The package assembly of claim 1 wherein:

said tape-substrate having a thickness ranging between one to four mils.

6. A tape-substrate provided for interposing between a flip-chip with a plurality of solder bumps and a printed circuit board (PCB) with a plurality of PCB copper-pads with solder paste provided for electrically connecting to a one of said solder bumps, comprising:

a patterned conductive layer includes a plurality of solder-bump contact pads each having a corresponding solder paste contact pad interconnected with a conductive trace wherein each of said contact pads disposed at a location corresponding to one of said solder bumps, and each of said solder paste contact pads disposed at a location corresponding to one of said solder pastes;

a top insulation layer having a plurality of solder-bump contact openings opened on top of each of said solder-bump contact pads; and a bottom insulation layer having a plurality of solder-paste contact openings open right below the solder-paste contact pads.

7. The tape-substrate of claim 6 wherein:

said tape-substrate having a thickness ranging between one to four mils.

8. The tape-substrate of claim 6 wherein:

said patterned conductive layer with said solder bump contact pads, said solder paste contact pads, and said conductive traces composed of copper.

9. The tape-substrate of claim 6 further comprising:

a top adhesive layer for attaching said top insulation layer to said patterned conductive layer and a bottom adhesive layer for attaching said bottom insulation layer to said patterned conductive layer.

10. The tape-substrate of claim 6 wherein:

said top insulation layer and said bottom insulation layer composed of polyimide.

11. A tape-substrate provided for interposing between a semiconductor chip and a printed circuit board (PCB), comprising:

a patterned conductive layer includes a plurality of solder-bump contact pads each having a corresponding solder paste contact pad interconnected with a conductive trace;

a top insulation layer having a plurality of solder-bump contact openings opened on top of each of said solder-bump contact pads; and a bottom insulation layer having a plurality of solder-paste contact openings open right below the solder-paste contact pads.

12. A method for manufacturing a tape-substrate for interposing between a semiconductor chip and a printed circuit board (PCB), comprising steps of:

patterning a conductive layer covered by a top insulation layer to form a plurality of solder-bump contact pads and a plurality of corresponding solder-paste contact pads and patterning a plurality of conductive traces for interconnecting each of solder-bump contact pads to one of said corresponding solder paste contact pads;

opening a plurality of solder-bump contact openings in said top insulation layer on top of and exposing each of said solder-bump contact pads;

attaching a bottom insulation layer below said patterned conductive layer; and opening a plurality of solder-paste contact openings in said bottom insulation layer right below and exposing each of said solder-paste contact pads.

13. A method for interposing a tape-substrate between a flip-chip with a plurality of solder bumps and a printed circuit board (PCB) with a plurality of PCB copper-pads with solder paste provided for electrically connecting to a one of said solder bumps, comprising:

patterning a conductive layer to form a plurality of solder-bump contact pads at locations corresponding to said solder bumps;

patterning said conductive layer to form a plurality of solder-paste contact pads at locations corresponding to said solder pastes;

patterning a plurality of conductive traces for interconnecting each of said solder-bump contact pads to a corresponding solder paste contact pads;

covering said conductive layer with a top insulation layer and opening a plurality of solder-bump contact openings on top of each of said solder-bump contact pads;

covering said conductive layer with a bottom insulation layer and opening a plurality of solder-paste contact openings right below said solder-paste contact pads; and mounting said IC chip onto said tape substrate with each of said solder-bumps contacting and soldering to said solder-bump contact pads.

14. The method of claim 13 further comprising a step of:

mounting said tape substrate onto said printed circuit board (PCB) with each of said solder-pastes contacting and soldering to said solder-paste contact pads.

* * * * *